(12) United States Patent
Seshan et al.

(10) Patent No.: US 6,715,663 B2
(45) Date of Patent: Apr. 6, 2004

(54) WIRE-BOND PROCESS FLOW FOR COPPER METAL-SIX, STRUCTURES ACHIEVED THEREBY, AND TESTING METHOD

(75) Inventors: Krishna Seshan, San Jose, CA (US); Kuljeet Singh, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 10/052,089

(22) Filed: Jan. 16, 2002

(65) Prior Publication Data

US 2003/0132766 A1 Jul. 17, 2003

(51) Int. Cl.$^7$ .................... B23K 31/02; G01R 31/02
(52) U.S. Cl. .................. 228/103; 228/104; 228/180.5; 228/215; 324/537; 324/754; 324/765
(58) Field of Search ............... 228/4.5, 180.5, 228/103, 104, 214, 215; 324/537, 754, 765

(56) References Cited

U.S. PATENT DOCUMENTS

| 5,060,051 | A | * | 10/1991 | Usuda | 257/765 |
| 5,308,686 | A | * | 5/1994 | Nagasaka et al. | 428/209 |
| 5,367,195 | A | * | 11/1994 | DiGiacomo et al. | 257/767 |
| 5,436,412 | A | * | 7/1995 | Ahmad et al. | 174/265 |
| 5,661,081 | A | * | 8/1997 | Hsue et al. | 438/106 |
| 5,734,200 | A | * | 3/1998 | Hsue et al. | 257/755 |
| 6,085,962 | A | * | 7/2000 | Jacobson et al. | 228/103 |
| 6,144,100 | A | * | 11/2000 | Shen et al. | 257/762 |
| 6,163,075 | A | * | 12/2000 | Okushima | 257/759 |
| 6,180,505 | B1 | * | 1/2001 | Uzoh | 438/614 |
| 6,274,935 | B2 | * | 8/2001 | Uzoh | 257/762 |
| 6,301,121 | B1 | * | 10/2001 | Lin | 361/783 |
| 6,424,036 | B1 | * | 7/2002 | Okada | 257/734 |
| 6,445,001 | B2 | * | 9/2002 | Yoshida | 257/48 |
| 6,457,234 | B1 | * | 10/2002 | Edelstein et al. | 29/843 |
| 6,521,996 | B1 | * | 2/2003 | Seshan | 257/737 |
| 6,534,863 | B2 | * | 3/2003 | Walker et al. | 257/737 |
| 2001/0000416 | A1 | * | 4/2001 | Uzoh | |
| 2001/0030363 | A1 | * | 10/2001 | Chopra et al. | |
| 2003/0036256 | A1 | * | 2/2003 | Efland et al. | |
| 2003/0075804 | A1 | * | 4/2003 | Gleixner et al. | |

FOREIGN PATENT DOCUMENTS

JP         403013558 A  *  1/1991

* cited by examiner

*Primary Examiner*—Kiley Stoner
(74) *Attorney, Agent, or Firm*—Schwegman, Lundberg, Woessner & Kluth, P.A.

(57) ABSTRACT

The present invention relates to a device that includes a low-ohmic test. The device includes a metallization copper pad such as metal-six, a metal first film such as Ni that is disposed above the metallization copper pad, and a metal second film such as Au that is disposed above the metal first film. The present invention also relates to a wire-bonding process, and to a method of pulling a first wire bond and making a second wire bond.

13 Claims, 4 Drawing Sheets

WIRE-BOND PROCESS FLOW FOR COPPER METAL-SIX, STRUCTURES ACHIEVED THEREBY, AND TESTING METHOD

FIELD OF THE INVENTION

The present invention relates generally to electrical testing (e-test) and wire bonding for a metallization process flow. More particularly, the present invention relates to an electroless plating process flow that follows e-test, and for a wire bonding process flow that follows a metal-six copper (M6 Cu) metallization.

DESCRIPTION OF RELATED ART

Figure 8:
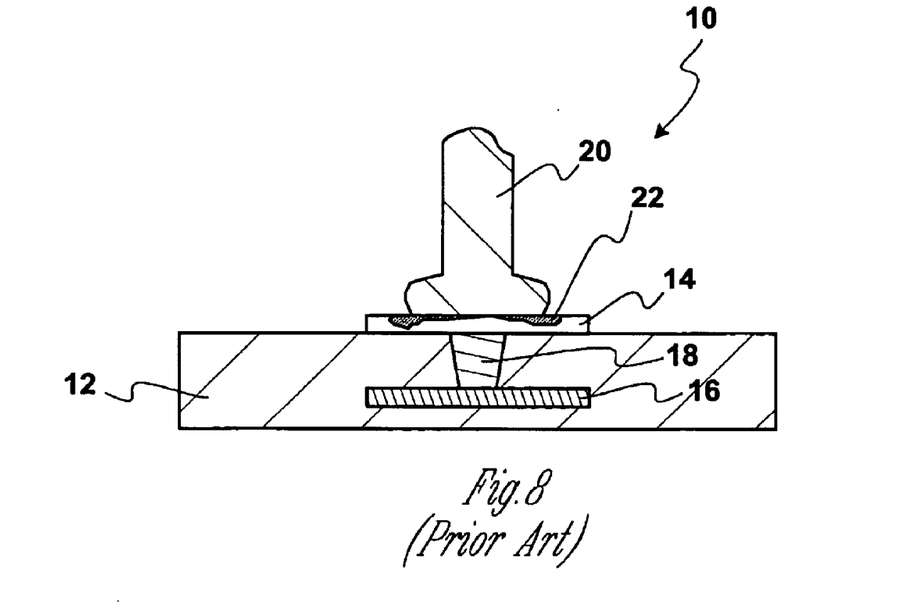
FIG. 8 is a cross-section of a known semiconductor structure.

Metallization process flows may be carried out near the back-end of processing by electrical connections such as a metal bump formation on a ball-limiting metallurgy (BLM) that surmounts the metallization pad, or by a wire bonding process on the metallization pad. During the wire bonding process, typically an aluminum or gold wire is used to make contact with the metallization pad. However, this process flow often causes significant corrosion of the metallization pad, particularly if it is copper, and the result is an unacceptable yield loss during the wire-bonding process. FIG. 8 depicts a prior art wire bond on a metallization pad that illustrates corrosion. A semiconductor structure 10 includes a substrate 12 and an upper metallization 14 such as a trace or pad, that is electrically connected to a lower metallization 16 through a contact 18. A wire bond 20 is depicted in connection with upper metallization 14. It is noted that upper metallization 14, if copper for example, has experienced corrosion 22 (depicted in an arbitrary size and shape).

The corrosion 22 has resulted from at least one of several environments or other conditions. For example, an aluminum wire bond 20 will corrode upper metallization 14, or processing conditions including back-end-of-line (BEOL) testing such as a hot ambient steam test (HAST) and/or burn-in, add to corrosion 22. Other processing conditions add to corrosion including the galvanic differential that is established between the two disparate metals of upper metallization 14 and wire bond 20. Once corrosion begins, a variable and unpredictable contact resistance (CRES) occurs between the numerous probes and the upper metallization 14. Additionally, a copper scumming of the probe tip requires frequent and unpredictable cleaning.

BRIEF DESCRIPTION OF THE DRAWINGS

In order to illustrate the manner in which embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a wire-bond process flow that minimizes copper corrosion in the copper pad or other metallization that is wire bonded. In one embodiment, a structure embodiment is disclosed that resists corrosion of the copper pad or other metallization during processing, testing, and field use. In another embodiment, the structure embodiment is used in an electrical testing (e-test) during wafer sorting, that does not damage the copper pad or the like, and that minimizes e-test error but also lowers the e-test resistance. In one embodiment, an e-test method is disclosed that uses the inventive structure embodiment.

Figure 1:
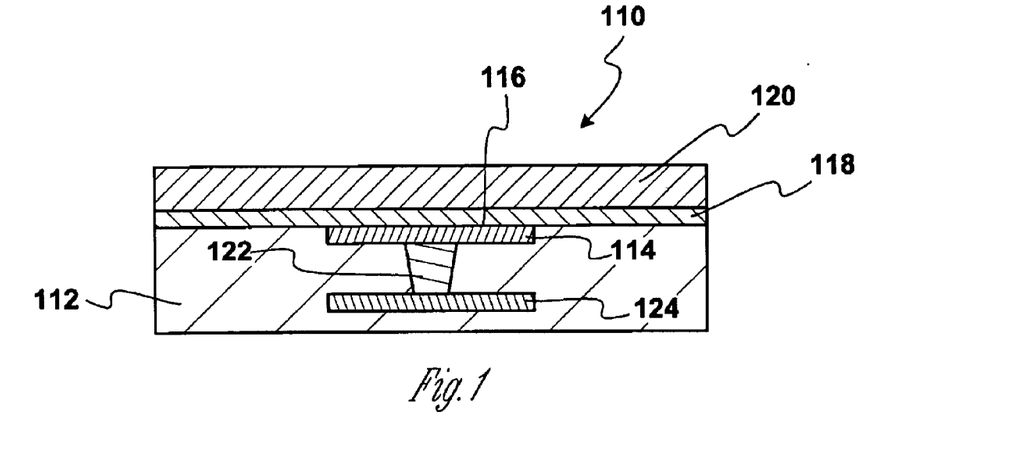
FIG. 1 is a cross-section of a semiconductor structure during processing according to an embodiment.

According to an embodiment, FIG. 1 is a cross-section of a semiconductor structure 110 during fabrication that includes a substrate 112 and metallization 114 such as copper pads that make connection to what is commonly referred to as metal-six copper (M6 Cu) by way of non-limiting example. Metallization 114 may be disposed with an upper surface 116 that is coplanar with substrate 112 where substrate 112 may be an interlayer dielectric (ILD) composition. A nitride layer 118 and a passivation layer 120 are formed over substrate 112 and metallization 114. It is noted that metallization 114 is connected through a contact 122 to a lower metallization 124.

Nitride layer 118 and passivation layer 120 act to protect substrate 112 and to expose a portion of metallization 114 according to subsequent patterning. Passivation layer 120 may be a polyimide material or it may be an inorganic material such as a silicon oxide that is formed by the decomposition of tetraethyl ortho silicate (TEOS). Patterning is accomplished by a mask (not pictured) that exposes passivation layer 120.

Figure 2:
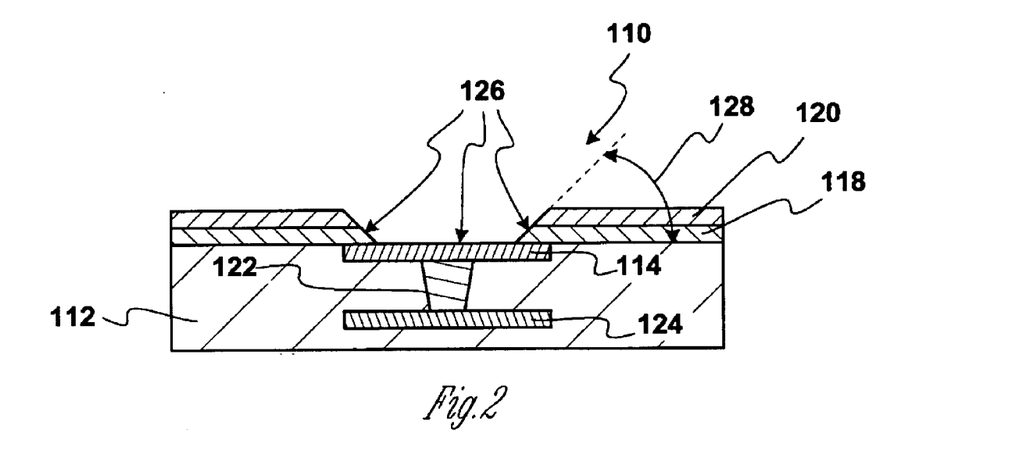
FIG. 2 is a cross-section of the semiconductor structure depicted in FIG. 1 after further processing.

FIG. 2 illustrates a patterned passivation structure, that includes portions of nitride layer 118 and passivation layer 120, and that exposes a portion of metallization 114. The process may be carried out by blanket forming nitride layer 118 and passivation layer 120, patterning, etching a recess 126, and curing passivation layer 120 where passivation layer 120 is a polyimide or the like. In one embodiment after the cure, passivation layer 120 has formed a slope that has an angle 128, in a range from about 30° to about 60°. In one embodiment after the cure, passivation layer 120 has formed angle 128 that is about 45°.

Figure 3:
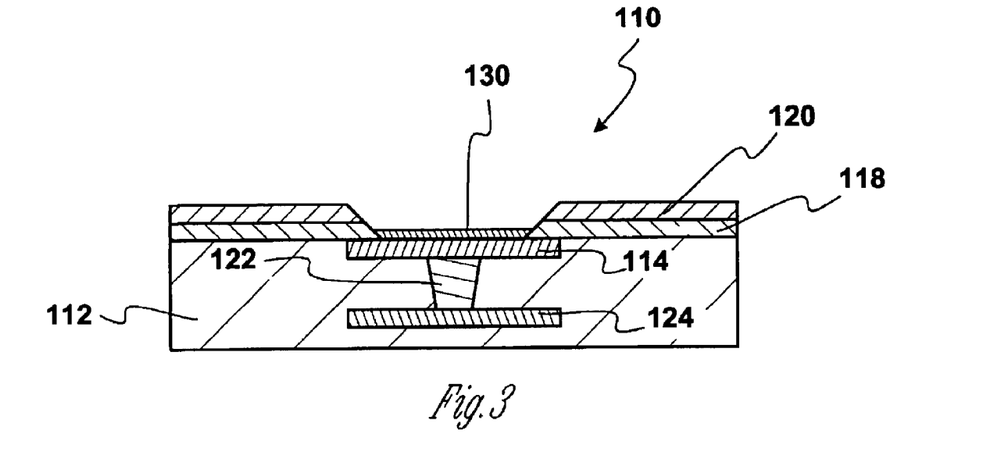
FIG. 3 is a cross-section of the semiconductor structure depicted in FIG. 2 after further processing.

FIG. 3 illustrates further processing according to embodiments. A protective structure is formed that protects metallization 114 during testing, but that also allows for a lower-resistance test method. In a first process flow, a protective structure is made that includes a metal first film 130 that is disposed above and on the metallization 114. Metal first film 130 acts as a penetration barrier that may otherwise prevent damage by a test probe tip during e-test according to an embodiment. The thickness of metal first film 130 is in a range from about 1,000 Å to about 1,500 Å. In another embodiment, the thickness of metal first film 130 is about 500 Å.

In one embodiment, metal first film 130 is a refractory (hard) metal or alloy, and metallization 114 is a M6 Cu pad. Metal first film 130 is formed by a deposition process flow that is selected from vapor deposition, electroplating, and electroless plating. The vapor deposition is selected from chemical vapor deposition (CVD), including modified CVD such as plasma-enhanced CVD (PECVD), and atomic layer CVD (ALCVD). In another embodiment, physical vapor deposition (PVD) is used for form metal first film 130. The conditions of PVD may be selected in order to achieve a desired morphology of metal first film 130. In the vapor depositing embodiments, after a blanket deposition, a center-patterned masking (not pictured) is carried out that blinds metal first film 130. Thereafter, an etch is used to strip off unwanted refractory metal material. The etch is a wet etch or a dry etch according to a selected process integration plan.

Refractory metals for metal first film 130 include nickel (Ni), palladium (Pd), platinum (Pt), and the like. In another embodiment, refractory metals for metal first film 130 include cobalt (Co), rhodium (Rh), iridium (Ir), and the like. In another embodiment, refractory metals for metal first film 130 include scandium (Sc), yttrium (Yt), lanthanum (La), cerium (Ce), and the like. One property embodiment is that metal first film 130 exhibits sufficient adhesion to the metallization that liftoff or spalling thereof will not occur during fabrication, test, and ordinary field use. In another embodiment, metal first film 130 is selected from nickel, palladium, cobalt, tungsten, chromium, titanium, ti-tungsten (TiW), zirconium, hafnium, and the like. Another property embodiment is that metal first film 130 is hard enough that an ordinary tungsten test probe or the like, will not penetrate metal first film 130 during ordinary e-test conditions.

Besides vapor depositing, liquid plating processing may be done. Such liquid plating processing embodiments include spray deposition, electroplating and electroless plating. One advantage of electroless plating of the metal first film 130, is that due to the chemically-induced oxidation-reduction reaction that is carried out only at chemically enabled sites, no post-deposition patterning and etching needs to be done. According to an embodiment, semiconductor structure 110 is immersed in a bath that contains one or more metal ions, and reduction of the ions occurs at the exposed portion of metallization 114 to form metal first film 130.

Figure 4:
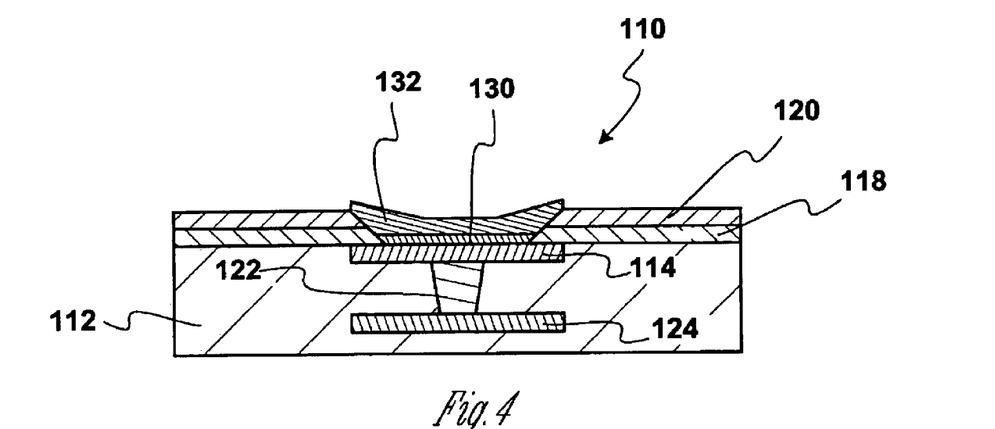
FIG. 4 is a cross-section of the semiconductor structure depicted in FIG. 3 after further processing.

As set forth herein, metal first film 130 is preferably a refractory metal. In conjunction with a second metal film 132 (see FIG. 4) and according to an embodiment, metal first film 130 is less noble than the second metal film 132 (FIG. 4). The metal ion or ions that are used to form metal first film 130 may be selected from various metals or combinations thereof. In one embodiment, the metal is selected from at least one primary metal and from zero to at least one secondary metal. The at least one primary metal is selected from the group of nickel (Ni), palladium (Pd), platinum (Pt), and combinations thereof. In one embodiment, the at least one primary metal is selected from the group of cobalt (Co), rhodium (Rh), iridium (Ir), and combinations thereof. In one embodiment, the at least one primary metal is selected from the group of copper (Cu), silver (Ag), gold (Au), and combinations thereof. In another embodiment, the at least one primary metal is selected from a combination of at least two metals that combine metals from the above-referenced groups. In one embodiment, the primary metal(s) is supplied in a concentration range from about 2 gram/liter to about 50 gram/liter. In another embodiment, the primary metal(s) is supplied in a concentration range from about 5 gram/liter to about 35 gram/liter.

In one embodiment, at least one secondary metal is added to the primary metal(s) to form metal first film 130. In one embodiment, the at least one secondary metal is selected from the group of chromium (Cr), molybdenum (Mo), tungsten (W), and combinations thereof. In another embodiment, the at least one secondary metal is selected from the group of manganese (Mn), technetium (Tc), rhenium (Re), and combinations thereof. In another embodiment, the at least one secondary metal is selected from a combination of at least two metals that combine metals from the above-referenced groups. In one embodiment, the secondary metal(s) is supplied in a concentration range from about 1 gram/liter to about 40 gram/liter. In another embodiment, the secondary metal(s) is supplied in a concentration range from about 2 gram/liter to about 35 gram/liter.

Reducing agents are provided to assist in assuring metal deposition if metal first film 130, as the chemical environment of the substrate onto which the metal deposits continues to change. Although initial deposition of a metal ion onto a substrate may be autocatalytic, the changing chemical environment may interrupt the autocatalytic environment. In one embodiment, where deposition is upon a Cu M6 metallization pad 114 as known in the art, initial deposition will be achieved in the presence of the Cu M6 pad 114. Consequently, the Cu M6 pad 114 affects the initial, presumably oxidation-reduction (REDOX) deposition chemistry. However, as the Cu M6 pad 114 is covered by way of non-limiting example, by nickel, the REDOX chemical environment changes from a nickel-onto-copper plating, to a nickel-onto-nickel plating. Accordingly, a reducing agent(s) is provided to assure continued nickel plating despite the changed substrate environment.

In one embodiment, the electroless plating composition is combined with from zero to at least one primary reducing agent in a mixture of solvents. In one embodiment, a primary reducing agent including boron (B) is provided. Primary reducing agents that can be utilized for this application include ammonium, alkali metal, alkaline earth metal borohydrides, and the like, and combinations thereof. In one embodiment, inorganic primary reducing agent embodiments include sodium borohydride, lithium borohydride, zinc borohydride, and the like, and combinations thereof In one embodiment, an organic primary reducing agent is dimethylaminoborane (DMAB). In another embodiment, other aminoboranes are used such as diethylaminoborane, morpholine borane, combinations thereof, and the like. In one embodiment, the primary reducing agent(s) is supplied in a concentration range from about 1 gram/liter to about 30 gram/liter. In another embodiment, the primary reducing agent(s) is supplied in a concentration range from about 2 gram/liter to about 20 gram/liter.

In one embodiment, a secondary reducing agent is provided to assist the changing chemical environment during deposition of the primary metal and optional secondary metal. However, the secondary reducing agent may be used alone, without the primary reducing agent. In one embodiment a phosphorus-containing compound is selected as the secondary reducing agent. Phosphorus-containing compounds may include hypophosphites. In one embodiment, the hypophosphite is selected from organic hypophosphites such as ammonium hypophosphite and the like.

In one embodiment, the hypophosphite is selected from inorganic hypophosphites such as sodium hypophosphite and the like. One embodiment includes an inorganic phosphorus-containing compound such as hypophosphites of lithium, sodium, potassium, and mixtures thereof. One embodiment includes an inorganic phosphorus-containing compound such as hypophosphites of, magnesium, calcium, strontium, and mixtures thereof. One embodiment includes an inorganic phosphorus-containing compound such as nickel hypophosphite and the like. One embodiment includes an inorganic phosphorus-containing compound such as hypophosphorous acid and the like.

Other secondary reducing agents are selected from sulfites, bisulfites, hydrosulfites, metabisulfites, and the like. Other secondary reducing agents are selected from dithionates, and tetrathionates, and the like. Other secondary reducing agents are selected from thiosulfates, thioureas, and the like. Other secondary reducing agents are selected from hydrazines, hydroxylamines, aldehydes, glyoxylic acid, and reducing sugars. In another embodiment, the secondary reducing agent is selected from diisobutylaluminum hydride, sodium bis(2-methoxyethoxy)aluminum hydride, and the like.

In one embodiment, the secondary reducing agent(s) is supplied in a concentration range from about 0 gram/liter to about 5 gram/liter. In another embodiment, the secondary reducing agent(s) is supplied in a concentration range from about 1 gram/liter to about 2 gram/liter.

In one embodiment, the primary reducing agent is DMAB in a concentration range from about 1 gram/liter to about 30 gram/liter, and the secondary reducing agent is ammonium hypophosphite in a concentration range from about 0 gram/liter to about 2 gram/liter. Other embodiments include primary and secondary reducing agents that are substituted for DMAB and ammonium hypophosphite, or one of them, as long as they approximate the gram equivalent amounts of the primary and secondary reducing agents of the DMAB and the ammonium hypophosphite. The gram equivalent amounts may be adjusted by various means, such as according to the comparative dissociation constants of the reducing agents.

In addition to the reducing agents, other agents may be added such alkaline metal-free chelating agents. Embodiments of chelating agents include citric acid, ammonium chloride, glycine, acetic acid, malonic acid, and the like in concentration range from about 5 gram/liter to about 70 gram/liter.

A complexing agent and a buffering agent are also used to hold the metal ion(s) in solution until deposition is appropriate. In one embodiment, an organic sulfate salt compound is used such as ammonium sulfate, $(NH)_2SO_4$ and the like. Other complexing and buffering agents may be selected that have an effective gram equivalent amount to the $(NH)_2SO_4$ such as copper sulfate, $CuSO_4$. In one embodiment, the complexing/buffering agent is supplied in a concentration range from about 50 gram/liter to about 1,000 gram/liter. In another embodiment, the complexing/buffering agent is supplied in a concentration range from about 80 gram/liter to about 600 gram/liter.

Various pH-adjusting compositions may be used including organic and inorganic bases. That a compound is basic can be easily confirmed by dipping pH test paper, measuring its aqueous solution using a pH meter, observing the discoloration caused by an indicator or measuring the adsorption of carbonic acid gas, and by other methods.

In one embodiment, the organic base compounds which can be used include organic amines such as pyridine, pyrrolidine, combinations thereof, and the like. Other embodiments include methylamine, dimethylamine, trimethylamine, combinations thereof, and the like. Other embodiments include ethylamine, diethylamine, triethylamine, combinations thereof, and the like. Other embodiments include tetramethylammonium hydroxide (TMAH), tetraethyl ammonium hydroxide (TEAH), tetrapropyl ammonium hydroxide (TPAH), tetrabutyl ammonium hydroxide (TBAH), combinations thereof, and the like. Other embodiments include aniline, toluidine, and the like.

In one embodiment, the organic base includes TMAH in a concentration range from about 30 mL to about 150 mL, added to a 100 mL volume of the other constituents of the inventive electroless plating solution. Other embodiments include the gram equivalent amounts of the organic base compounds set forth herein.

In one embodiment, the inorganic base compounds which can be used are salts of strong bases and weak acids. In one embodiment, alkali metal acetates, alkaline earth metal acetates, and combinations thereof are used. In one embodiment, alkali metal propionates, alkaline earth metal propionates, and combinations thereof are used. In one embodiment, alkali metal carbonates, alkaline earth metal carbonates, and combinations thereof are used. In one embodiment, alkali metal hydroxides, alkaline earth metal hydroxides, and combinations thereof are used. In one embodiment, combinations of at least two of the acetates, propionates, carbonates, and hydroxides is used.

Inorganic base compounds may be provided in a concentration such as a 25% sodium hydroxide, NaOH in a deionized (DI) water solution, to make a volume of about 10 mL to about 50 mL. This volume of solution is added to an about 100 mL volume of the other inventive electroless plating composition constituents. Other embodiments include the gram equivalent amounts of the inorganic base compounds set forth herein.

Other compounds may be added to the inventive electroless plating composition such as surface active agents. One commercial surfactant is RHODAFAC RE 610, made by Aventis (formerly Rhone-Poulenc Hoechst). Another commercial surfactant is Triton x-100T™ made by Sigma-Aldrich. Other surfactants include cystine, polyethylene glycols, polypropylene glycol (PPG)/polyethylene glycol (PEG) (in a molecular range of approximately 200 to 10,000) in a concentration range of about 0.01 to 5 gram/liter, and the like.

Several combinations of primary and secondary metals are achievable according to various embodiments. The primary metal may include, but is not limited to from zero to at least one metal, selected from nickel, palladium, platinum, cobalt, rhodium, iridium, copper, silver, and gold and combinations thereof, although other refractory metals may be selected as set forth herein. The secondary metal may include, but is not limited to from zero to at least one metal selected from chromium, molybdenum, tungsten, manganese, technetium, and rhenium. In one embodiment, because of the presence of at least one of the primary and secondary reducing agents, a metallic compound forms that incorporates at least one of boron and phosphorus. In one embodiment, nickel is a primary metal for an electroless plating embodiment to form metal first film 130, the composition includes a nickel solution to form a nickel plating layer. According to an embodiment, where nickel is the primary metal, because of the inventive electroless plating bath environment, a metallic film forms that includes but is not limited by such combinations as NiB, NiP, NiBP, NiCrB, NiCrP, NiCrBP, NiMoB, NiMoP, NiMoBP, NiWB, NiWP, NiWBP, NiMnB, NiMnP, NiMnBP, NiTcB, NiTcP, NiTcBP, NiReB, NiReP, and NiReBP. In these nickel compounds, as in other embodiments set forth in this disclosure, where a given element is listed first, second, third, etc., one embodiment includes the largest presence in the first-listed element, the second largest presence in the second listed element, etc. Thus, where NiCrB is set forth, the concentrations may be 70Ni28Cr2B, by way of non-limiting example. Where two primary metals are used in solution, the inventive electroless plating bath environment may form metal first film 130 that includes but is not limited by such combinations as to NiCoB, NiCoP, NiCoBP, NiCoCrB, NiCoCrP, NiCoCrBP, NiCoMoB, NiCoMoP, NiCoMoBP, NiCoWB, NiCoWP, NiCoWBP, NiCoMnB, NiCoMnP, NiCoMnBP, NiCoTcB, NiCoTcP, NiCoTcBP, NiCoReB, NiCoReP, and NiCoReBP. It can be seen that at least zero- to at least one primary metals and from zero to at least one secondary metals are combinable according to various embodiments. In similar embodiments, palladium can be used in place of—or in addition to nickel. Similarly, platinum can be used in place of—or in addition to nickel. Additionally, a blend of at least two of nickel, palladium, and platinum can be used as set forth herein.

In another embodiment, metal first film 130 uses cobalt is a primary metal for an electroless plating embodiment, the composition includes a cobalt solution to form a cobalt plating layer. According to an embodiment, where cobalt is the primary metal, because of the inventive electroless plating bath environment, metallic films form that include but are not limited by such combinations as CoB, CoP, CoBP, CoCrB, CoCrP, CoCrBP, CoMoB, CoMoP, CoMoBP, CoWB, CoWP, CoWBP, CoMnB, CoMnP, CoMnBP, CoTcB, CoTcP, CoTcBP, CoReB, CoReP, and CoReBP. Where two primary metals are used in solution, the inventive electroless plating bath environment may form metallic films that include but not are limited by such combinations as to CoNiB, CoNiP, CoPdBP, CoPdCrB, CoPdCrP, CoPdCrBP, CoPdMoB, CoPdMoP, CoPdMoBP, CoPdWB, CoPdWP, CoPdWBP, CoPdMnB, CoPdMnP, CoPdMnBP, CoPdTcB, CoPdTcP, CoPdTcBP, CoPdReB, CoPdReP, and CoPdReBP.

It can be seen that zero to at least one primary metal and from zero to at least one secondary metal are combinable according to various embodiments to form metal first film 130. In similar embodiments, rhodium can be used in place of, or in addition to cobalt. Similarly, iridium can be used in place of, or in addition to cobalt. Additionally, a blend of at least two of cobalt, rhodium, and iridium can be used as set forth herein.

By way of non-limiting example, copper is used to form metal first film 130 as a primary metal for an electroless plating embodiment. The composition includes a copper solution to form a copper plating layer. According to an embodiment, where copper is the primary metal, because of the inventive electroless plating bath environment, metallic films form that include but are not limited by such combinations as CuB, CuP, CuBP, CuCrB, CuCrP, CuCrBP, CuMoB, CuMoP, CuMoBP, CuWB, CuWP, CuWBP, CuMnB, CuMnP, CuMnBP, CuTcB, CuTcP, CuTcBP, CuReB, CuReP, and CuReBP. Where two primary metals are used in solution, the inventive electroless plating bath environment may form metallic films that include but not are limited by such combinations as to CuNiB, CuNiP, CuNiBP, CuNiCrB, CuNiCrP, CuNiCrBP, CuNiMoB, CuNiMoP, CuNiMoBP, CuNiWB, CuNiWP, CuNiWBP, CuNiMnB, CuNiMnP, CuNiMnBP, CuNiTcB, CuNiTcP, CuNiTcBP, CuNiReB, CuNiReP, and CuNiRpBP. It can be seen that from zero to at least one primary metal and from zero to at least one secondary metal is combinable according to various embodiments. In similar embodiments, silver can be used in place of, or in addition to copper. Similarly, gold or silver can be used in place of—or in addition to copper. Additionally, a blend of at least two of copper, silver, and gold can be used as set forth herein.

FIG. 4 illustrates further processing after the formation of metal first film 130. A metal second film 132 is formed that in one embodiment is at least one of a more noble, or a softer (more ductile) metal than metal first film 130. In one embodiment, metal second film 132 is selected from gold, doré, platinum, and the like. In another embodiment, metal second film 132 is aluminum, and metal first film 130 is selected from titanium, tungsten, ti-tungsten, zirconium, hafnium, and other refractory metals and refractory metal alloys as set forth herein.

One embodiment includes a metal second film 132 that resists alloying with a bond wire (see FIG. 6) during ordinary wire-bonding process flows. Typically, an aluminum bond wire is attached to metal second film 132. In such embodiments, metal second film 132 is of a composition that is substantially immiscible with aluminum under ordinary wire-bonding conditions.

The formation of metal second film 132 is carried out according to vapor or liquid plating techniques as set forth herein. In one embodiment, metal second film 132 is carried out by electroless plating by using a gold-cyanide electroless plating solution, and the Merrill-Crowe technique. In this embodiment, an atom-thick layer of zinc (Zn, not pictured) is pre-plated onto metal first film 130 by an electroless process that does not substantially cover passivation layer 120, and the gold-cyanide solution is contacted with the zinc which causes the reduction of the gold out of the gold-cyanide complex.

In another electroless plating embodiment, semiconductor structure 110 is contacted with a gold halide solution, and the Eh-pH environment of the solution is manipulated according to the technique pioneered by Pourbaix. In one embodiment, metal first film 130 acts as an autocatalytic surface to assist the selective precipitation of the gold of metal second film 132 as depicted in FIG. 4.

In another embodiment, a CVD process is carried out during which a organometallic gold vapor or a gold halide vapor is metered toward semiconductor structure 110, blanket deposited, and patterned with an etch. In another embodiment, a PVD process is carried out in which a gold target is impinged under PVD conditions to form a blanket layer of gold that is subsequently patterned into metal second film 132.

In another embodiment, a metal second film 132 is aluminum that is formed on a metal first film 130 of titanium. The formation of metal second film 132 is by CVD or PVD.

In one embodiment, metal first film 130 has a thickness in a range from about 500 Å to about 2,000 Å. In another embodiment, metal first film 130 has a thickness of about 1,000 Å. In one embodiment, metal second film 132 has a thickness in a range from about 100 nm to about 1,000 nm. In one embodiment, metal second film 132 has a thickness in a range from about 300 nm to about 500 nm. In one embodiment, metal first film 130 is from about 500 Å to about 2,000 Å and metal second film 132 is from about 0.3 microns to about 0.5 microns.

Figure 5:
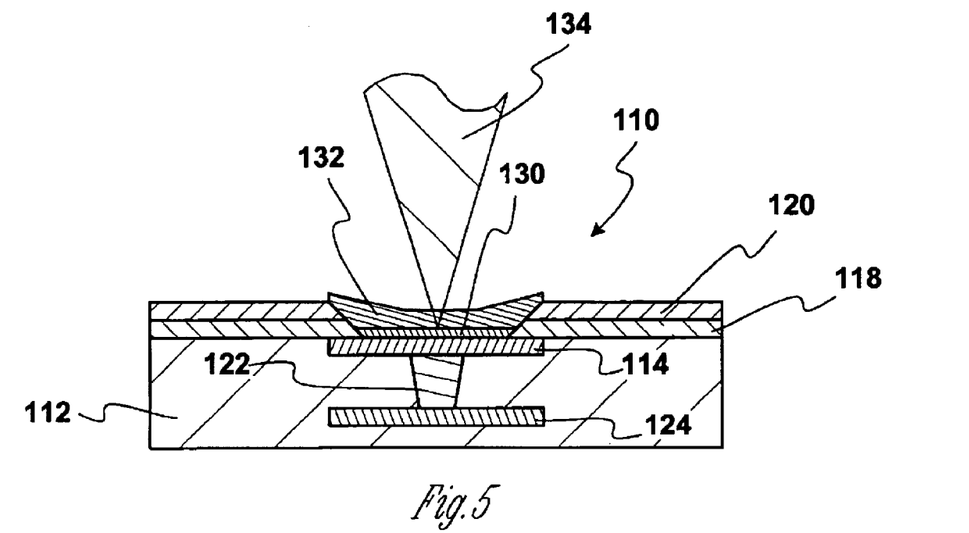
FIG. 5 is a cross-section of the semiconductor structure depicted in FIG. 4 after further processing, and that also illustrates an e-test embodiment.
Figure 6:
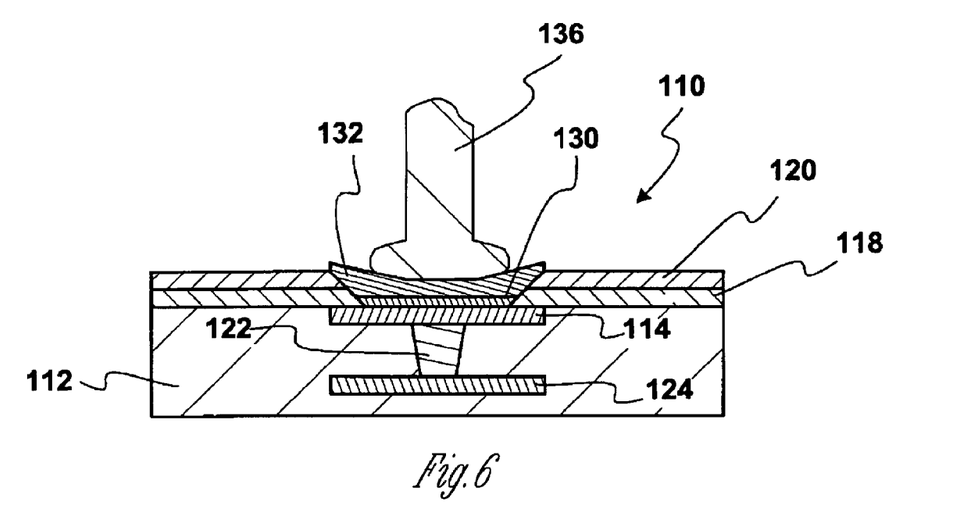
FIG. 6 is a cross-section of the semiconductor structure depicted in FIG. 4, after further processing, and that also illustrates a wire-bond embodiment.

Another embodiment of the present invention relates to an e-test method according to the process embodiments. FIG. 5 illustrates semiconductor structure 110 during an e-test, before wire bonding is carried out (FIG. 6). A tungsten test probe tip 134 or the like is depicted as penetrating into and through metal second film 132, and making contact against metal first film 130 without penetrating it. Tip 134 under prior methods, experienced an ohmic resistance in a range from about 5 ohms (Ω) or greater. According to an embodiment, the ohmic resistance during an e-test is in a range from about 0.5 Ω to about 4 Ω. In another embodiment, the ohmic resistance during an e-test is in a range from about 0.75 Ω to about 2 Ω. In another embodiment, the ohmic resistance during an e-test is in a range from about 0.95 Ω to about 1.5 Ω. In another embodiment, the ohmic resistance during an e-test is about 1 Ω.

In a first example, a protective structure is formed by plating nickel as a metal first film 130, and gold as a metal second film 132. Patterning is done by a clear field mask to center-pattern metal first film 130 and metal second film 132. Etching is carried out, followed by testing. During the probe test, the ohmic resistance is in a range from about 0.5 Ω to about 4 Ω, and the first standard deviation of the ohmic resistance is less than about 2 Ω.

In a second example, a protective structure was formed by depositing titanium as a metal first film 130, and depositing aluminum as a metal second film 132. Patterning was done by a clear field mask to center-pattern metal first film 130 and metal second film 132. Etching was carried out, followed by testing. During the probe test, the ohmic resistance had a mean value of about 1.5 Ω, and the first standard deviation of the ohmic resistance was about 0.1 Ω.

In a comparative example, a tungsten test probe tip was impinged on a copper metallization. The ohmic resistance had a mean value of about 5 Ω, and the first standard deviation of the ohmic resistance was about 2 Ω. During this comparative example, a deformation of the copper metallization was observed, as well as a scumming of the tungsten test probe tip with some of the copper.

Under previous process flows, and according to previous architectures, corrosion of the upper metallization would be significant enough to cause the rejection of several devices during the probe for sort e-test. According to an embodiment of the present invention, metal first film 130 protects copper metallization 114 from physical stresses, and metal second film 132 protects copper metallization from corrosive stresses.

FIG. 6 illustrates an embodiment of the semiconductor structure 110 after e-test, or after further processing. A bond wire 136 is depicted as having been bonded to metal second film 132. As set forth herein, the metal of bond wire 136 is selected from aluminum and the like according to known technique. Metal second film 132 is a material that resists alloying with bond wire 136, and preferably is a gold, doré, or platinum material.

One feature of an embodiment is the ability of the metal second film 132 to bond with bond wire 136, but not to alloy therewith. In some applications, a bond wire article may be rejected by pulling or cutting the bond wires and repeating the bond wire process flow. According to an embodiment, because metallization 114 is significantly protected from both physical and corrosive stresses, the bond wire 136 is cut or pulled away from metal second film 132, and wire bonding is repeated with no significant change in the ohmic resistance through metal second film 132 and metal first film 130. Accordingly, ohmic resistance in a second bond wire process when compared to a first bond-wire process changes, by a range from about 50% reduction to about 150% improvement, and in another embodiment, from about 10% reduction to about 110% improvement.

Figure 7:
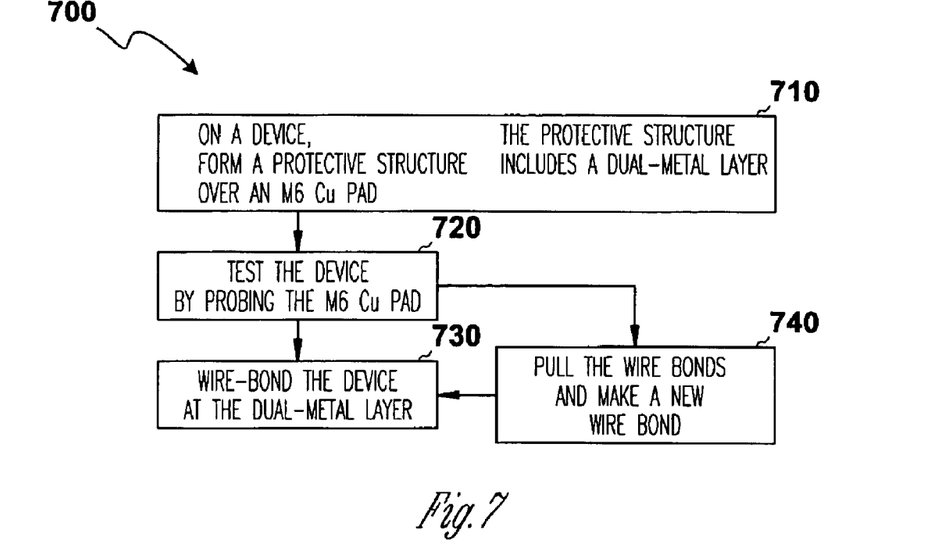
FIG. 7 illustrates a process flow according to an embodiment.

FIG. 7 is a process flow depiction according to an embodiment. The process 700 commences by forming 710 a protective structure above a metallization. In one particular exemplary embodiment, the protective structure includes metal first film 130 and metal second film 132 as illustrated in FIGS. 4–6. Further, the metallization is an M6 Cu pad 114. Next, the process of an e-test is depicted by testing 720 the device by probing the metallization with a probe tip. After an e-test, the process continues by wire bonding 730 the device to the protective structure. In one particular exemplary embodiment, the protective structure is the metal second film 132 that is bonded to the bond wire. Finally, where the rejection of a wire-bonding run is required, the wire bond is pulled and a replacement wire bonding is done 740.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of forming a wire bond comprising:
   forming a protective structure over a metallization copper pad, wherein the metallization copper pad makes contact with a device, and wherein the protective structure includes a metal first film disposed above and on the metallization copper pad and a metal second film disposed above and on the metal first film;
   at the metal second film, wire bonding the device; and
   by probing the metal second film, electrically testing the device.

2. A process of forming a wire bond comprising:
   forming a protective structure over a metallization copper pad, wherein the metallization copper pad makes contact with a device, and wherein the protective structure includes a metal first film disposed above and on the metallization copper pad and a metal second film disposed above and on the metal first film; and
   at the metal second film, wire bonding the device, wherein forming a protective structure includes:
   forming a first passivation layer over the metallization copper pad;
   forming a second passivation layer over the metallization copper pad; and
   patterning the first and second passivation layers to expose at least a portion of the metallization copper pad.

3. A process of forming a wire bond comprising:
   forming a protective structure over a metallization copper pad, wherein the metallization copper pad makes contact with a device, and wherein the protective structure includes a metal first film disposed above and on the metallization copper pad and a metal second film disposed above and on the metal first film; and
   at the metal second film, wire bonding the device, wherein the metal first film is electrolessly plated with a composition including:
   from zero to at least one primary metal selected from cobalt, rhenium, iridium, nickel, palladium, platinum, titanium, zirconium, hafnium, copper, silver, gold, and combinations thereof;
   from zero to at least one secondary metal selected from chromium, molybdenum, tungsten, manganese, technetium, rhenium, and combinations thereof;

from zero to at least one primary reducing agent in a concentration range from about 1 gram/liter to about 30 gram/liter;
from zero to at least one secondary reducing agent in a concentration range from about 0 gram/liter to about 2 gram/liter;
a complexing and buffering agent; and
at least one pH adjusting agent.

4. A process of forming a wire bond comprising:
forming a protective structure over a metallization copper pad, wherein the metallization copper pad makes contact with a device, and wherein the protective structure includes a metal first film disposed above and on the metallization copper pad and a metal second film disposed above and on the metal first film;
at the metal second film, wire bonding the device; and
by probing the metal second film, electrically testing the device, wherein the test probe tip penetrates the metal second film and stops before penetrating the metal first film.

5. A process of forming a wire bond comprising:
forming a protective structure over a metallization copper pad, wherein the metallization copper pad makes contact with a device, and wherein the protective structure includes a metal first film disposed above and on the metallization copper pad and a metal second film disposed above and on the metal first film;
at the metal second film, wire bonding the device;
by probing the metal second film, electrically testing the device; and
following passing a test current, further including:
first bonding a first bond wire to the metal second film.

6. A process of forming a wire bond comprising:
forming a protective structure over a metallization copper pad, wherein the metallization copper pad makes contact with a device, and wherein the protective structure includes a metal first film disposed above and on the metallization copper pad and a metal second film disposed above and on the metal first film;
at the metal second film, wire bonding the device;
by probing the metal second film, electrically testing the device; and
following passing a test current, further including:
first bonding a first bond wire to the metal second film;
removing the first bond wire; and
second bonding a second bond wire to the metal second film.

7. A process of forming a wire bond comprising:
forming a protective structure over a metallization copper pad, wherein the metallization copper pad makes contact with a device, and wherein the protective structure includes a metal first film disposed above and on the metallization copper pad and a metal second film disposed above and on the metal first film;
at the metal second film, wire bonding the device;
wherein forming a protective structure includes:
forming a first passivation layer over the metallization copper pad;
forming a second passivation layer over the metallization copper pad; and
patterning the first and second passivation layers to expose at least a portion of the metallization copper pad, wherein patterning the first and second passivation layers forms a slope that has an angle in a range from about 30° to about 60°.

8. A process of forming a wire bond comprising:
forming a protective structure over a metallization copper pad, wherein the metallization copper pad makes contact with a device, and wherein the protective structure includes a metal first film disposed above and on the metallization copper pad and a metal second film disposed above and on the metal first film;
at the metal second film, wire bonding the device
by probing the metal second film, electrically testing the device;
first bonding a first bond wire to the metal second film;
removing the first bond wire; and
second bonding a second bond wire to the metal second film.

9. The process according to claim 8, further including:
by probing the metal second film, electrically second testing the device, wherein electrically second testing the metal second film includes an ohmic resistance change in a range from about 50% reduction to about 150% improvement over electrically first testing the device.

10. A process comprising:
forming a protective structure over a metallization copper pad, wherein the metallization copper pad makes contact with a device, and wherein the protective structure includes a metal first film disposed above and on the metallization copper pad and a metal second film disposed above and on the metal first film; and
at the metal second film, wire bonding the device;
wherein the metal first film is electrolessly plated with a composition including:
from zero to at least one primary metal selected from cobalt, rhenium, iridium, nickel, palladium, platinum, titanium, zirconium, hafnium, copper, silver, gold, and combinations thereof;
from zero to at least one secondary metal selected from chromium, molybdenum, tungsten, manganese, technetium, rhenium, and combinations thereof;
from zero to at least one primary reducing agent in a concentration range from about 1 gram/liter to about 30 gram/liter;
from zero to at least one secondary reducing agent in a concentration range from about 0 gram/liter to about 2 gram/liter;
a complexing and buffering agent; and
at least one pH adjusting agent.

11. The process according to claim 10, further including:
by probing the metal second film, electrically testing the device.

12. The process according to claim 10, wherein the metal first film is nickel, and wherein the metal second film is gold.

13. The process according to claim 10, wherein the metal first film is titanium, and wherein the metal second film is aluminum.

* * * * *